(12) United States Patent
Han et al.

(10) Patent No.: US 11,713,962 B2
(45) Date of Patent: *Aug. 1, 2023

(54) NANOSTRUCTURED OPTICAL ELEMENT, DEPTH SENSOR, AND ELECTRONIC DEVICE

(71) Applicant: SAMSUNG ELECTRONICS CO., LTD., Suwon-si (KR)

(72) Inventors: Seunghoon Han, Seoul (KR); Byunghoon Na, Suwon-si (KR); Jangwoo You, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 131 days.

This patent is subject to a terminal disclaimer.

(21) Appl. No.: 17/322,385

(22) Filed: May 17, 2021

(65) Prior Publication Data

US 2021/0270601 A1    Sep. 2, 2021

Related U.S. Application Data

(63) Continuation of application No. 15/984,831, filed on May 21, 2018, now Pat. No. 11,041,713.

(30) Foreign Application Priority Data

Aug. 14, 2017  (KR) ........................ 10-2017-0103214

(51) Int. Cl.
*H01S 5/40*    (2006.01)
*G02B 1/00*    (2006.01)
(Continued)

(52) U.S. Cl.
CPC .............. *G01B 11/22* (2013.01); *G02B 1/002* (2013.01); *G02B 3/0056* (2013.01); *G02B 3/08* (2013.01);
(Continued)

(58) Field of Classification Search
CPC .. G02B 1/002; G02B 27/0172; G02B 5/1809; G02B 5/1842; G02B 2027/0178; G02B 6/00; G02B 1/02; G02B 2027/0174; G02B 27/425; G02B 3/0056; G02B 3/08; G02B 6/0026; G02B 6/005; G02B 2027/0109;
(Continued)

(56) References Cited

U.S. PATENT DOCUMENTS 5,138,495 A    8/1992  Shiono et al.
8,947,509 B2   2/2015  Bloom et al.
(Continued)

*Primary Examiner* — Brandi N Thomas
(74) *Attorney, Agent, or Firm* — Sughrue Mion, PLLC

(57) ABSTRACT

Provided are a nanostructured optical element, a depth sensor, and an electronic device. The nanostructured optical element includes: a light source in which a plurality of laser sources irradiating light are configured as an array; a meta-pattern layer including a plurality of first nano-posts that are two-dimensionally configured while satisfying a sub-wavelength condition, wherein the plurality of first nano-posts are configured to change the light from the light source into structured light; and a deflecting layer between the light source and the meta-pattern layer, and configured to change a proceeding direction of the light to make the light from the light source be incident to the meta-pattern layer.

11 Claims, 13 Drawing Sheets

(51) Int. Cl.
| | |
|---|---|
| *G02B 5/18* | (2006.01) |
| *G01B 11/22* | (2006.01) |
| *H01S 5/183* | (2006.01) |
| *H01S 5/12* | (2021.01) |
| *G02B 3/08* | (2006.01) |
| *G02B 3/00* | (2006.01) |
| *H01S 5/42* | (2006.01) |
| *G02B 27/42* | (2006.01) |
| *B82Y 20/00* | (2011.01) |
| *H01S 5/00* | (2006.01) |
| *H01S 5/042* | (2006.01) |

(52) U.S. Cl.
CPC ......... *G02B 5/1842* (2013.01); *G02B 27/425* (2013.01); *H01S 5/12* (2013.01); *H01S 5/183* (2013.01); *H01S 5/4025* (2013.01); *H01S 5/423* (2013.01); *B82Y 20/00* (2013.01); *H01S 5/005* (2013.01); *H01S 5/0427* (2013.01)

(58) Field of Classification Search
CPC .... G02B 2027/0125; G02B 2027/0134; G02B 2207/101; G02B 5/1823; G02B 6/0013; G02B 6/0031; G02B 6/0065; G02B 6/0076; G02B 6/1226; G02B 6/29316; G02B 2005/1804; G02B 2027/011; G02B 2027/0116; G02B 2027/014; G02B 26/06; G02B 27/0025; G02B 27/0093; G02B 27/0938; G02B 27/28; G02B 27/286; G02B 27/288; G02B 27/4205; G02B 27/4261; G02B 30/35; G02B 5/1871; G02B 5/30; G02B 5/3016; G02B 5/3025; G02B 5/3058; G02B 6/0011; G02B 6/0016; G02B 6/34; G02B 1/04; G02B 1/111; G02B 2027/0112; G02B 2027/0123; G02B 2027/0156; G02B 2027/0185; G02B 26/02; G02B 26/08; G02B 26/12; G02B 26/121; G02B 27/005; G02B 27/0103; G02B 27/0176; G02B 27/0179; G02B 27/09; G02B 27/0916; G02B 27/0922; G02B 27/0927; G02B 27/10; G02B 27/1006; G02B 27/106; G02B 27/12; G02B 27/123; G02B 27/4272; G02B 3/0062; G02B 5/18; G02B 5/1814; G02B 5/1847; G02B 5/1857; G02B 6/0023; G02B 6/24; H01S 5/423; H01S 5/4025; H01S 5/026; H01S 2301/176; H01S 5/0207; H01S 5/02345; H01S 5/02415; H01S 5/02469; H01S 5/042; H01S 5/04256; H01S 5/04257; H01S 5/12; H01S 5/183; H01S 5/18305; H01S 5/18308; H01S 5/18311; H01S 5/18319; H01S 5/18341; H01S 5/18369; H01S 5/18377; H01S 5/18386; H01S 5/18388; H01S 5/18391; H01S 5/343; H01S 5/005; H01S 5/0427; H01S 5/18361; H01S 5/187; H01S 5/4012; G02F 1/1337; G02F 1/137; G02F 1/13768; G02F 1/133504; G02F 1/133526; G02F 1/133528; G02F 1/133541; G02F 1/13363; G02F 1/133638; G02F 1/1347; G02F 1/1393; G02F 1/292; G02F 1/294; G02F 2203/05; G02F 2203/24; G02F 2413/02; G02F 1/33; G02F 1/37; G02F 2202/30; A61B 118/1477; A61B 2018/0016; A61B 2018/00577; A61B 2018/00654; A61B 2018/00702; A61B 2018/00714; A61B 2018/00791; A61B 2018/00797; A61B 2018/00875; A61B 2018/143; A61B 2018/1472; A61B 2018/1475; A61B 2018/00089; A61B 2562/0233; A61B 2562/046; A61B 2562/185; A61B 5/0075; A61B 5/1455; A61B 5/6832; A61B 5/7203; A61B 5/7221; A61B 8/4405; A61B 8/4483; A61B 8/4488; A61B 8/4494

See application file for complete search history.

(56) References Cited

U.S. PATENT DOCUMENTS

| | | | |
|---|---|---|---|
| 9,239,467 | B2 | 1/2016 | Shpunt et al. |
| 9,354,041 | B2 | 5/2016 | Yamagata |
| 11,041,713 | B2 * | 6/2021 | Han ........................ H01S 5/183 |
| 2012/0281206 | A1 | 11/2012 | Ko et al. |
| 2015/0176977 | A1 | 6/2015 | Abele et al. |
| 2016/0197452 | A1 | 7/2016 | Mor |
| 2018/0217305 | A1 | 8/2018 | Valera |

* cited by examiner

NANOSTRUCTURED OPTICAL ELEMENT, DEPTH SENSOR, AND ELECTRONIC DEVICE

CROSS-REFERENCE TO RELATED APPLICATION

This application is a Continuation of U.S. application Ser. No. 15/984,831 filed May 21, 2018, which claims the benefit of priority from Korean Patent Application No. 10-2017-0103214, filed on Aug. 14, 2017, in the Korean Intellectual Property Office, the disclosures of which are incorporated herein in their entireties by reference.

BACKGROUND

1. Field

Example embodiments relate to nanostructured optical elements, depth sensors, and/or electronic devices.

2. Description of the Related Art

Recently, demand for smartphones has been increasing rapidly. Thus, an image sensor included in a smartphone has been actively developed. An image sensor typically includes a plurality of pixels converting photons of a desired, or alternatively predetermined spectrum band into electrons. A three-dimensional (3D) image may be obtained based on information about color and depth between an object and the image sensor. Typical methods of obtaining depth information between the image sensor and the object may include time of flight (TOF) and structured light. The TOF method may be described as a method of detecting a phase shift and a method of using a light pulse. The structured light method may obtain depth information by irradiating structured light to the object and monitoring the structured light distortion on the object.

SUMMARY

Example embodiments relate to nanostructured optical elements, depth sensors, and/or electronic devices.

Additional example embodiments will be set forth in part in the description which follows and, in part, will be apparent from the description, or may be learned by practice of the example embodiments.

According to an example embodiment, a nanostructured optical element may include a light source in which a plurality of laser sources irradiating light are configured as an array, a meta-pattern layer including a plurality of first nano-posts that are two-dimensionally configured while satisfying a sub-wavelength condition, wherein the plurality of first nano-posts are configured to change the light from the light source into structured light, and a deflecting layer between the light source and the meta-pattern layer, the deflecting layer being configured to change a proceeding direction of the light to make the light from the light source incident to the meta-pattern layer.

The laser source may be one of a VCSEL laser, a Fabry-Perot type laser diode, a distributed feedback (DFB) type laser diode.

The deflecting layer may include a convex lens or a Fresnel lens.

The deflecting layer may include a plurality of second nano-posts that are two-dimensionally configured while satisfying the sub-wavelength condition.

The nanostructured optical element may further include a supporting layer between the meta-pattern layer and the deflecting layer.

The meta-pattern layer may be provided on a first surface of the supporting layer, and the deflecting layer may be provided on a second surface of the supporting layer.

The meta-pattern layer may further include a supporting layer supporting the plurality of first nano-posts, and the meta-pattern layer may have a refractive index that is greater than a refractive index of the supporting layer by one (1) or more.

The plurality of first nano-posts may be configured as a hexagonal lattice or a rectangular lattice.

The plurality of first nano-posts may have asymmetric forms.

At least some of the plurality of first nano-posts may have different shapes from each other.

At least some of the plurality of first nano-posts may have different widths or different heights from each other.

The plurality of first nano-posts may have multi-layered structures.

The plurality of first nano-posts may include a metal material.

The plurality of first nano-posts may be configured so that the structured light that passes through the meta-pattern layer does not overlap with one another in a spatial frequency domain.

The plurality of first nano-posts may be configured so that the structured light that passes through the meta-pattern layer overlaps with other structured light on the spatial frequency domain.

The meta-pattern layer may change the light from the light source into structured light having a one-dimensional periodical pattern or structured light having a two-dimensional periodical pattern.

The meta-pattern layer may change the light from the light source into structured light having random pattern.

The nanostructured optical element may further include an addressing unit configured to independently address the plurality of laser sources configured as an array.

According to an example embodiment, a depth sensor may include a nanostructured optical element configured to irradiate structured light to an object, a light-receiving sensor configured to receive the structured light reflected from the object, and a controller configured to obtain distance information by analyzing the structured light received by the light receiving sensor.

According to an example embodiment, an electronic device includes the nanostructured optical element according to the above description.

BRIEF DESCRIPTION OF THE DRAWINGS

These and/or other example embodiments will become apparent and more readily appreciated from the following description, taken in conjunction with the accompanying drawings in which.

DETAILED DESCRIPTION

Figure 1A:
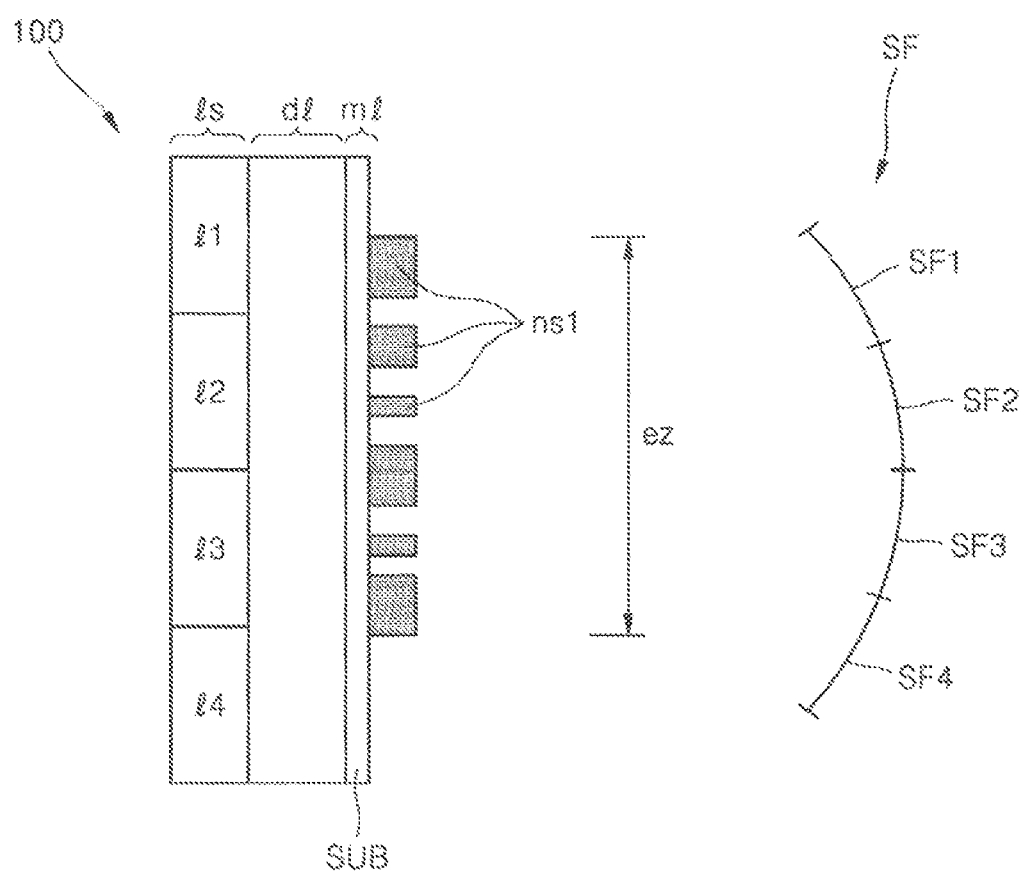
FIGS. 1A and 1B are schematic diagrams of a nanostructured optical element, according to an example embodiment.

Hereinafter, a nanostructured optical element, a depth sensor, and an electronic device will be described in detail with reference to accompanying drawings. Thickness and size of each component in the drawings are exaggerated, omitted or schematically illustrated for the sake of clear and easy illustration. Throughout the specification, like reference numerals denote the like elements.

All terms including descriptive or technical terms which are used herein should be construed as having meanings that are obvious to one of ordinary skill in the art. However, the terms may have different meanings according to an intention of one of ordinary skill in the art, precedent cases, or the appearance of new technologies. Also, some terms may be arbitrarily selected by the applicant. In this case, the meaning of the selected terms will be described in the detailed description. Thus, the terms used herein have to be defined based on the meaning of the terms together with the description throughout the specification.

It will be understood that although the terms "first" and "second" are used herein to describe various elements, these elements should not be limited by these terms. Terms are only used to distinguish one element from other elements.

An expression used in the singular encompasses the expression of the plural, unless it has a clearly different meaning in the context. Throughout the specification, when a portion "includes" an element, another element may be further included, rather than excluding the existence of the other element, unless otherwise described.

Figure 1B:
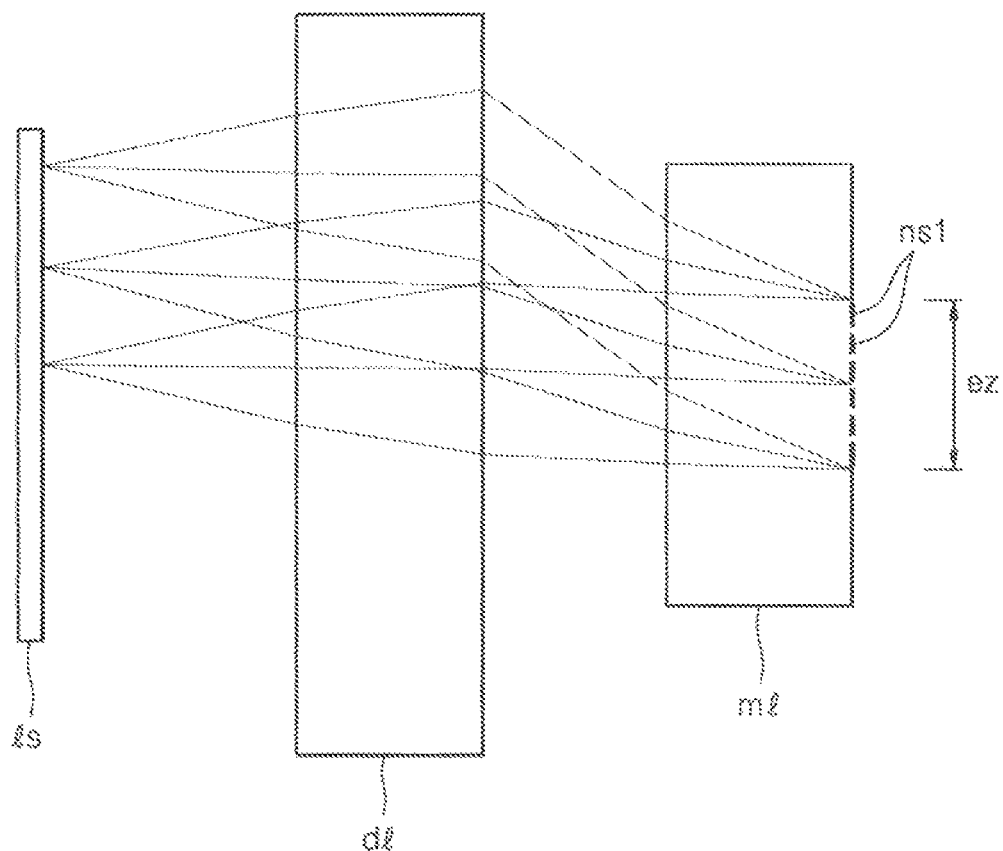

FIGS. 1A and 1B are schematic diagrams of a nanostructured optical element 100, according to an example embodiment. Referring to FIGS. 1A and 1B, the nanostructured optical element 100 includes a light source Is, a deflecting layer dl, and a meta-pattern layer ml. According to the nanostructured optical element 100 of the example embodiment, light irradiated from the light source Is is converted into structured light in the meta-pattern layer ml and may be irradiated to a spatial frequency domain SF.

The light source Is may include a plurality of laser sources I1, I2, I3, and I4 that are configured as an array to irradiate light. For example, the plurality of laser sources I1, I2, I3, and I4 may be configured as a one-dimensional or two-dimensional (2D) array. The light source Is may include, for example, one of a VCSEL laser, a Fabry-Perot type laser diode, and a distributed feedback (DFB) type laser diode.

In some example embodiments, the meta-pattern layer ml modulates the light irradiated from the light source Is to the structured light and irradiates the structured light to the spatial frequency domain SF. When the light from the light source Is is incident to the meta-pattern layer ml, the meta-pattern layer ml generates distribution of rays of light proceeding in a space. The rays of light generate patterns including beam spots in a desired, or alternatively predetermined spatial frequency domain SF. Such patterns may have various distributions defined by detailed conditions applied to the meta-pattern layer ml. The light having the patterns is referred to herein as structured light.

The structured light generated by the meta-pattern layer ml may be mathematically coded so that bright and dark spots may exclusively designate coordinates of locations in each direction. Such patterns may be transformed by a three-dimensional (3D) object, and the transformation may be imaged by an imaging device such as, for example, a camera, to compare the patterns and to trace the degree of transformation of the pattern of each coordinate to extract depth information of the 3D object.

In some example embodiments, the spatial frequency domain SF may be partitioned into first to fourth sub spatial frequency domains SF1, SF2, SF3, and SF4 according to location. For example, the sub spatial frequency domains SF1, SF2, SF3, and SF4 may respectively correspond to laser sources I1, I2, I3, and I4. For example, light irradiated from the first laser source I1 may pass through the meta-pattern layer ml and form the structured light on a first sub spatial frequency domain SF1. Likewise, the second laser source I2 may correspond to a second sub spatial frequency domain SF2, the third laser source I3 may correspond to a third sub spatial frequency domain SF3, and the fourth laser source I4 may correspond to a fourth sub spatial frequency domain SF4. The light that passes through the meta-pattern layer ml may form the structured light of an identical form on a corresponding sub spatial frequency domain SF1, SF2, SF3, or SF4, regardless of the laser source I1, I2, I3, or I4 irradiating the light.

The meta-pattern layer ml may include a plurality of nano-posts ns1 that are two-dimensionally configured and distributed to change the light irradiated from light source into the structured light. The plurality of first nano-posts ns1 may be configured to satisfy a sub-wavelength condition. The sub-wavelength condition denotes a condition, in which dimensions defining shape of nano-posts (e.g., width, height, and pitch) are smaller than an operating wavelength of the meta-pattern layer ml. For example, a dimensional magnitude of the plurality of first nano-posts ns1 is half the operating wavelength of the meta-pattern layer ml or less, the meta-pattern layer ml may operate in a high scattering unit to improve an efficiency of optical modulation. However, the dimensional magnitude of the plurality of first nano-posts ns1 is not limited to half the operating wavelength of the meta-pattern layer ml or less.

The plurality of first nano-posts ns1 may each have a transmission intensity and a transmission phase having distinctive values according to a material and a shape thereof. A shape distribution of the plurality of first nano-posts ns1 may be adjusted to adjust a distribution of phase or intensity of the light passing through the meta-pattern layer ml. For example, a size of the nano-post ns1 in a horizontal or vertical direction or a material of the first nano-post ns1 may be adjusted according to the location of the first nano-post ns1, in order to obtain a desired transmission intensity distribution or transmission phase distribution. In order to form the desired transmission intensity distribution or the transmission phase distribution, a shape distribution of the first nano-posts ns1 according to the locations thereof may be defined in a desired, or alternatively predetermined group including the plurality of first nano-posts ns1. Also, the group of the first nano-posts ns1 may be repeatedly arranged with a desired, or alternatively predetermined period. The shape distribution of the plurality of first nano-posts ns1 may be regular, periodical, or quasi-periodical, but is not limited thereto, that is, the shape distribution of the plurality of first nano-posts ns1 may be random. An effective zone ez, in which the plurality of first nano-posts ns1 are configured to form the structured light, may be defined on the meta-pattern layer ml.

Figure 2A:
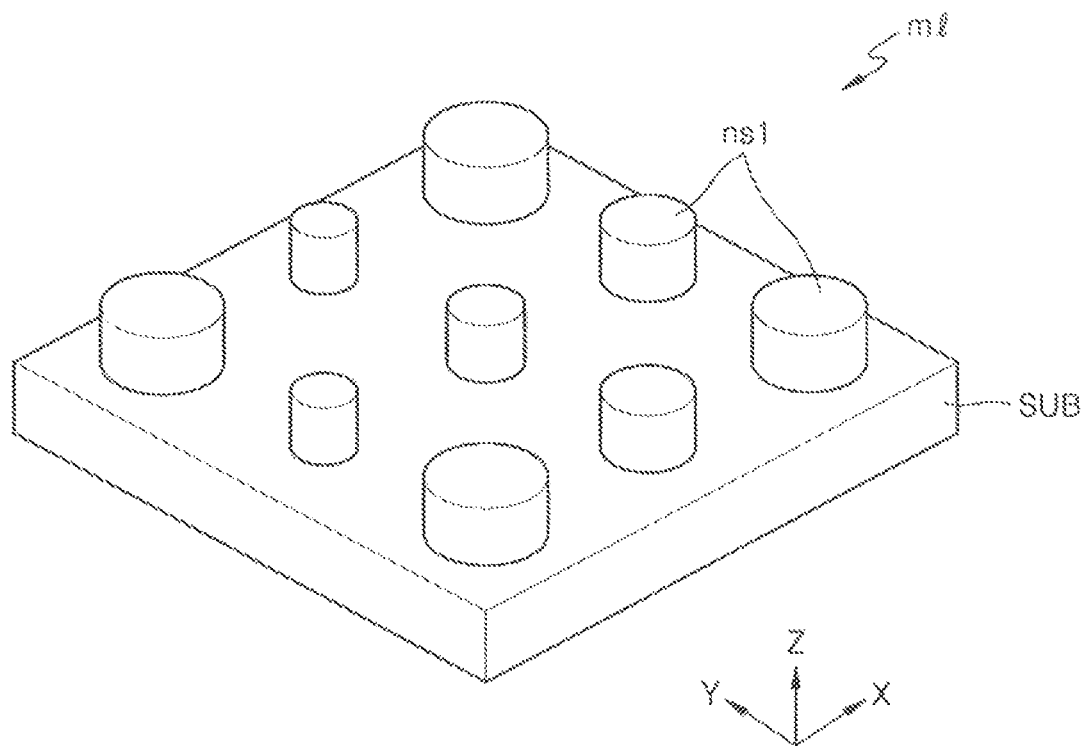
FIGS. 2A and 2B are schematic diagrams of a meta surface layer, according to an example embodiment.
Figure 2B:
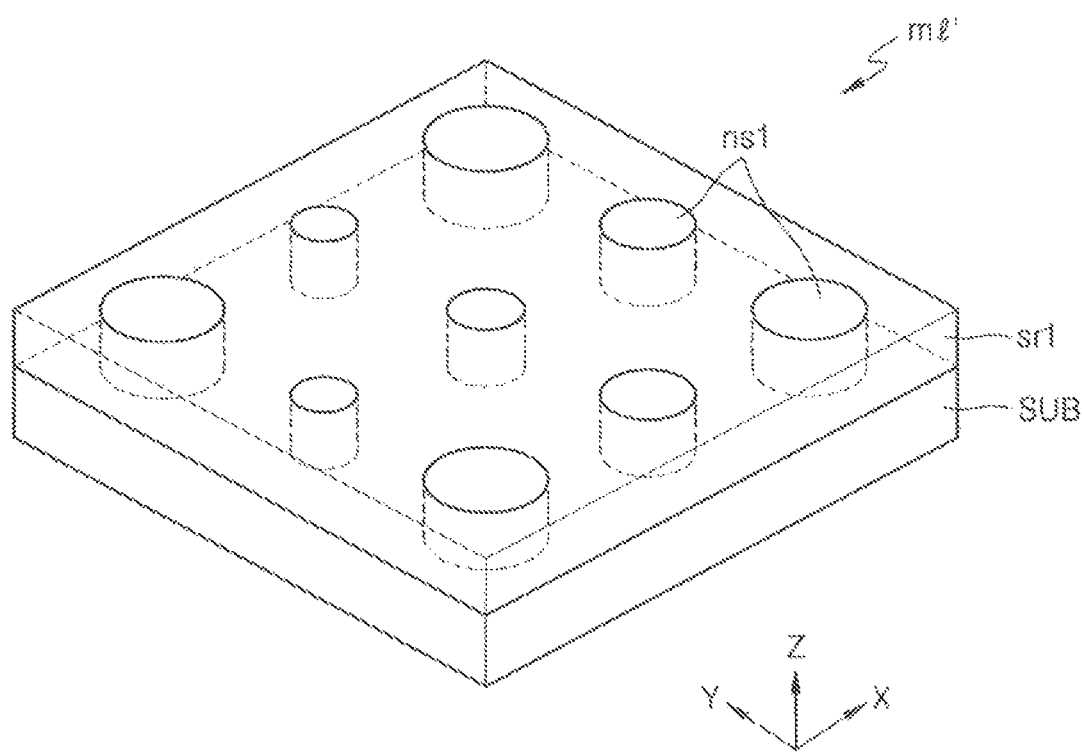

The meta-pattern layer ml may include, as illustrated in FIGS. 2A and 2B, a supporting layer SUB supporting the first nano-posts ns1. For example, the supporting layer SUB may include $SiO_2$, transparent conductive oxide (TCO), or a polymer such as polycarbonate (PC), polystyrene (PS), and polymethyl methacrylate (PMMA). The material included in the support layer SUB is not limited to the above examples, and, for example, the supporting layer SUB may include a semiconductor material. For example, the supporting layer SUB and the plurality of first nano-posts ns1 may both include an identical semiconductor material, e.g., a group III-V semiconductor compound. Also, a composition ratio of the compound may be adjusted to have a refractive index of the supporting layer SUB less than the refractive index of the plurality of first nano-posts ns1. For example, a difference between the refractive index of the supporting layer SUB and the refractive index of the plurality of first nano-posts ns1 may be about 1.0 or greater. The first nano-posts ns1 may be surrounded by a first peripheral material including air, as described below with reference to FIG. 2B.

The plurality of first nano-posts ns1 may have, for example, a refractive index greater than the refractive index of the supporting layer SUB. For example, the plurality of first nano-posts ns1 may include a material including one of single crystalline silicon, polycrystalline silicon (poly Si), amorphous silicon (Si), $Si_3N_4$, GaP, $TiO_2$, AlSb, AlAs, AlGaAs, AlGaInP, BP, and $ZnGeP_2$.

The plurality of first nano-posts ns1 may include a metal material. Here, the plurality of first nano-posts ns1 may modulate optical characteristics by using a surface plasmon effect. For example, the plurality of first nano-posts ns1 may include metal such as silver (Ag), gold (Au), copper (Cu), aluminum (Al), etc., but are not limited thereto.

In some example embodiments, the deflecting layer dl is between the light source Is and the meta-pattern layer ml. The deflecting layer dl may change a direction of the light according to the location of the light irradiated from each of, or at least one of, the laser sources I1, I2, I3, and I4 of the light source Is, so that the light may be incident to the meta-pattern layer ml. For example, the deflecting layer dl may change the direction of the light, so that the light irradiated from the laser sources I1, I2, I3, and I4 of the light source Is may be incident to the effective zone ez of the meta-pattern layer ml. The light irradiated from the first laser source I1, light irradiated from the second laser source I2, light irradiated from the third laser source I3, and light irradiated from the fourth laser source I4 have different irradiation locations and emission angles from one another, and the deflecting layer dl may change the optical paths of the light so that the light irradiated from the first laser source I1, the second laser source I2, the third laser source I3, and the fourth laser source I4 proceeds towards the effective zone ez of the meta-pattern layer ml. Through the deflecting layer dl, the structured light of the identical pattern may be generated regardless of the irradiation location of the laser sources I1, I2, I3, and I4. For example, the deflecting layer dl may include an optical device such as a convex lens and a Fresnel lens. For example, the deflecting layer dl may be a meta surface configured to perform phase change and angle change according to a location, based on the intention of a user. For example, the deflecting layer dl may include a plurality of second nano-posts ns2 that satisfy the sub-wavelength condition and are two-dimensionally configured. The example embodiment will be described in detail with reference to FIG. 3.

FIGS. 2A and 2B are schematic diagrams of a meta-surface layer according, to an example embodiment. Referring to FIGS. 2A and 2B, a meta-pattern layer m11 may include a plurality of first nano-posts ns1 having different shapes from one another.

As described above, the meta-pattern layer m11 according to the example embodiment has a function of changing the light irradiated from the light source (not shown) into the structured light. To do this, the meta-pattern layer m11 may have the plurality of first nano-posts ns1, each of which having a function of phase modulation according to the location thereof. When the light transmits through the plurality of first nano-posts ns1, the intensity and phase of the light may be changed. The intensity and phase of the light transmitting through the plurality of first nano-posts ns1 may be contemporaneously or simultaneously changed. Therefore, based on the far-field diffraction principle of Fourier optics, a desired transmission characteristic on each location in the meta-pattern layer m11 is designed, and then, detailed arrangement of the plurality of first nano-posts ns1 may be obtained.

Referring to FIG. 2A, the two-dimensional configuration of the plurality of first nano-posts ns1 may vary depending on the shape of the structured light that a user desires to realize. For example, at least some of the plurality of first nano-posts ns1 may have different thicknesses or different heights from each other. For example, since at least some of the plurality of first nano-posts ns1 have different widths from each other, spatial phase modulations corresponding thereto may be different from each other. Otherwise, at least some of the plurality of first nano-posts ns1 have different heights from each other, and thus, spatial phase modulations corresponding thereto may be different from each other. Otherwise, at least some of the plurality of first nano-posts ns1 have different shapes from each other, and thus, spatial phase modulations corresponding thereto may be different from each other.

In some example embodiments, the plurality of first nano-posts ns1 may have a multi-layered structure. For example, the plurality of first nano-posts ns1 may include a plurality of layers including different materials from one another. For example, each of, or at least one of, the plurality of first nano-posts ns1 may include a first layer and a second layer on the first layer, the first layer including a first material and the second layer including a second material. In this case, various transmission characteristics may be exhibited according to kinds of materials or a thickness of each layer. For example, the plurality of first nano-posts ns1 may each include a first layer and a third layer including a metal material, and a material having high refractive index between the first layer and the third layer.

Referring to FIG. 2B, the meta-pattern layer ml' may include a first peripheral material sr1 surrounding the plurality of first nano-posts ns1. The first peripheral material sr1 may have a refractive index that is lower than the refractive index of the plurality of first nano-posts ns1. For example, the first peripheral material sr1 may include $SiO_2$, TCO, or a polymer such as PC, PS, and PMMA. Otherwise, the first peripheral material sr1 may include gas such as, for example, air, or another gas. For example, a difference between the refractive index of the first peripheral material sr1 and the refractive index of the plurality of first nano-posts ns1 may be about 1.0 or greater. The first peripheral material sr1 and the supporting layer SUB may include an identical material, but are not limited thereto.

Figure 3:
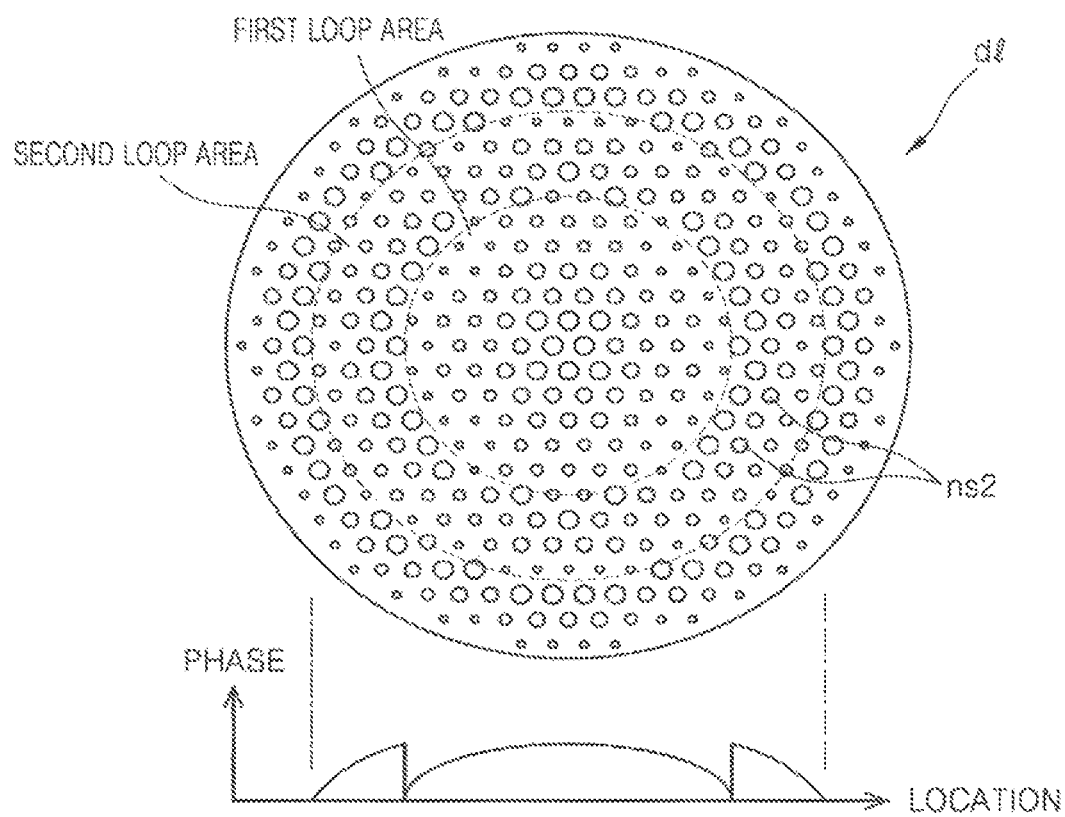
FIG. 3 is a schematic diagram of a planar structure and phase distribution of a deflecting layer, according to an example embodiment.

FIG. 3 schematically shows a planar structure of the deflecting layer dl and a phase distribution, according to an example embodiment. Referring to FIG. 3, the deflecting layer dl may be a metal surface including a plurality of second nano-posts.

In some example embodiments, the deflecting layer dl is between the light source (Is of FIG. 1) and the meta-pattern layer (ml of FIG. 1), as described above, in order to change the proceeding direction of light from the light source and make the light be incident to the meta-pattern layer. The deflecting layer dl may include a convex lens or a Fresnel lens. The deflecting layer dl, according to an example embodiment, is manufactured by semiconductor processes to include the plurality of second nano-posts ns2 that are two-dimensionally configured, and thus, is easy to be miniaturized and thus decreases manufacturing costs.

In order for the deflecting layer dl to have functions of a focusing optics, the plurality of second nano-posts ns2 may be configured symmetrically based on a center. For example, referring to FIG. 3, the deflecting layer dl may have a plurality of loop areas in order to perform as a Fresnel lens. Each of, or at least one one, the loop areas may be an area, in which diameters of cross-sections of the nano-posts gradually decrease away from a desired, or alternatively predetermined point. For example, the deflecting layer dl may include the plurality of loop areas including a first loop area and a second loop area away from the center thereof. However, the deflecting layer dl is not limited to the above example, but may include the second nano-posts ns2 in various arrangements.

The plurality of second nano-posts ns2 may include a material including one of single crystalline silicon, polycrystalline silicon (poly Si), amorphous silicon (Si), $Si_3N_4$, GaP, $TiO_2$, AlSb, AlAs, AlGaAs, AlGaInP, BP, and $ZnGeP_2$. Otherwise, the plurality of second nano-posts ns2 may include a metal material.

The deflecting layer dl may include a supporting layer (not shown) supporting the second nano-posts ns2. Since the supporting layer SUB is described above with reference to FIG. 1A, descriptions thereof are omitted here. The plurality of second nano-posts ns2 may have a refractive index that is higher than the refractive index of the supporting layer (not shown). The deflecting layer dl may include a second peripheral material layer (not shown) surrounding the second nano-posts ns2, and descriptions thereof are omitted since the descriptions are already provided above with reference to FIG. 2B.

Figure 4:
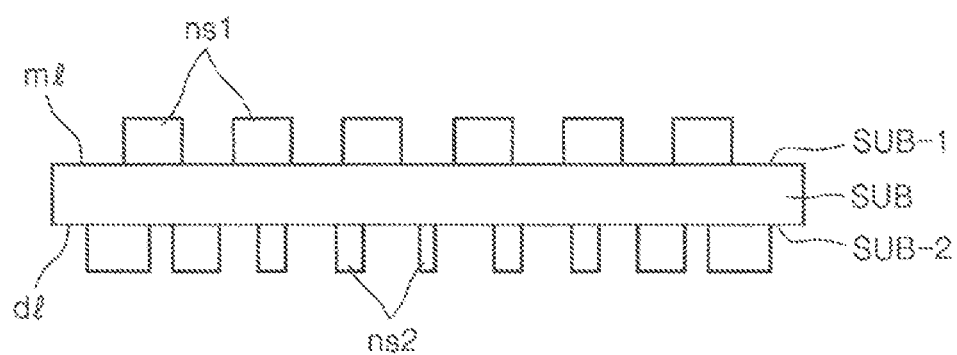
FIG. 4 is a schematic diagram of a deflecting layer and a meta surface layer provided on opposite surfaces of a supporting layer, according to an example embodiment.
Figure 5A:
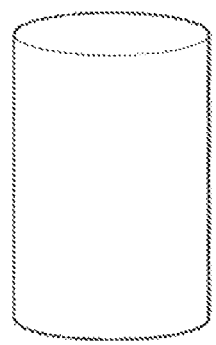
FIGS. 5A to 5D are perspective views of nano-posts according to one or more example embodiments.
Figure 5B:
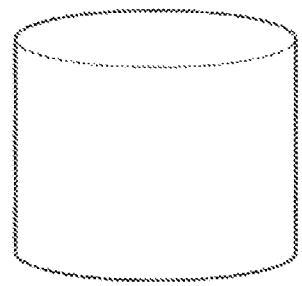
Figure 5C:
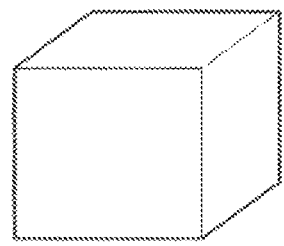
Figure 5D:
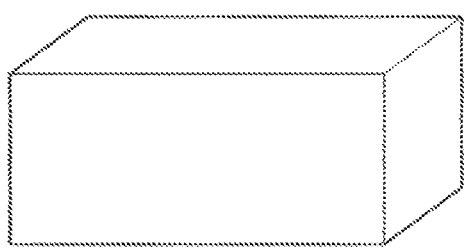

FIG. 4 is a schematic diagram of structures of the deflecting layer dl and the meta-pattern layer ml respectively provided on opposite surfaces of the supporting layer SUB, according to the example embodiment. Referring to FIG. 4, the meta-pattern layer ml is on a first surface SUB-1 of the supporting layer SUB, and the deflecting layer dl is on a second surface SUB-2 of the supporting layer SUB.

FIGS. 5A to 5D are perspective views showing shapes of a nano-post, according to one or more example embodiments. Referring to FIGS. 5A to 5D, the nano-post may have various shapes. The nano-post may have a pillar structure. For example, the nano-post may have a cross-section having one of a circular shape, an oval shape, a rectangular shape, and a square shape. When the nano-post has an asymmetric cross-section, the nano-post may be able to adjust light polarization.

For example, when the meta-pattern layer includes a configuration of the nano-posts having asymmetric cross-sections, the meta-pattern layer may make the incident light have varying phase and intensity transmission characteristics according to a polarization state of the light.

Figure 6:
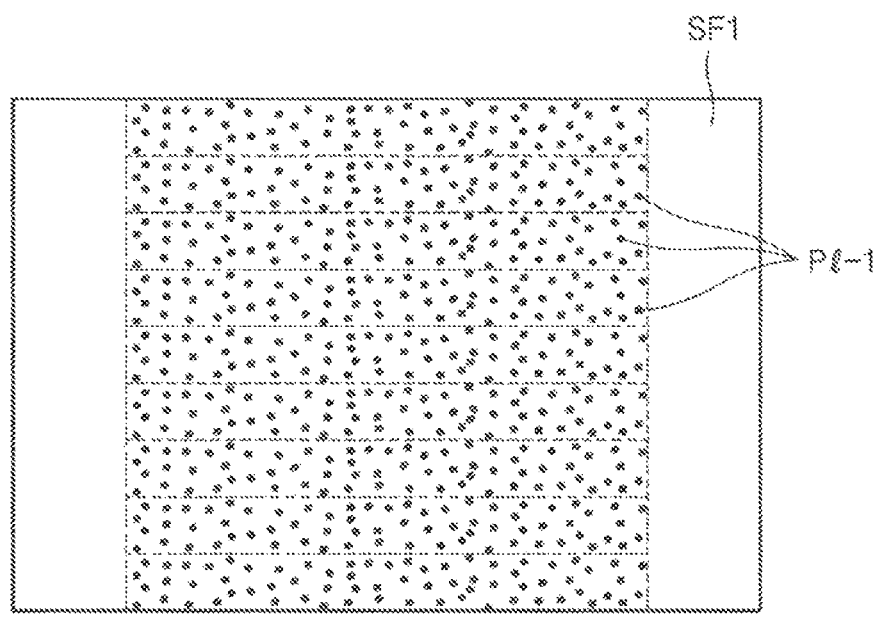
FIG. 6 is a diagram of structured light according to an example embodiment.

FIG. 6 is a diagram of a pattern PI-1 of structured light, according to an example embodiment. Referring to FIG. 6, the structured light may have a one-dimensional periodical pattern. The meta-pattern layer, according to the example embodiment may change the light from the light source so that the structured light may have a one-dimensional periodical pattern. A gap between the patterns provided periodically may be exaggerated, and alternatively, the periodical patterns may be successively configured without a gap therebetween.

Figure 7:
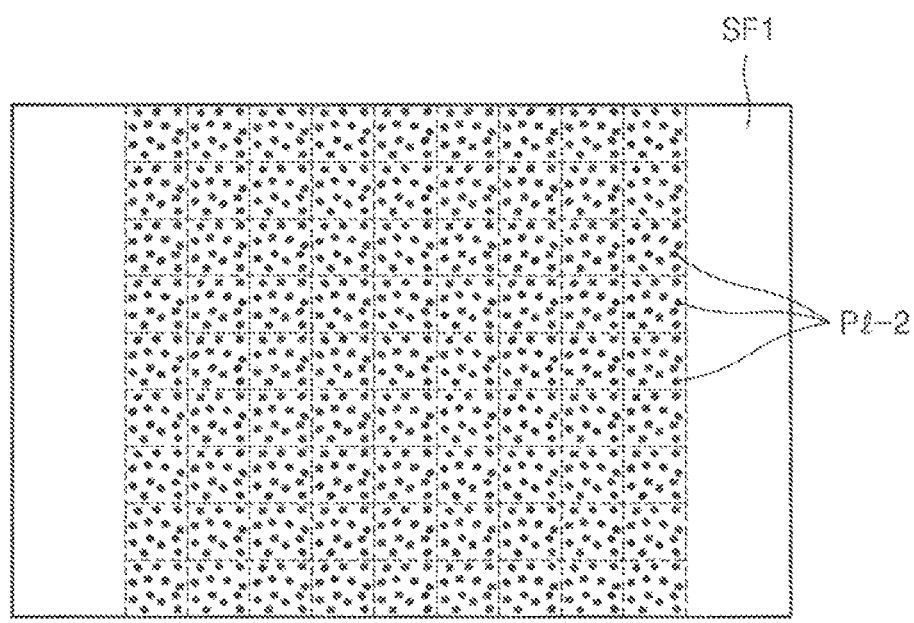
FIG. 7 is a diagram of structured light according to an example embodiment.

FIG. 7 is a diagram showing structured light PI-2, according to another example embodiment. Referring to FIG. 7, the structured light may have a two-dimensional periodical pattern. The meta-pattern layer according to the example embodiment may change the light from the light source so that the structured light may have a two-dimensional periodical pattern. A gap between the patterns provided periodically may be exaggerated, and alternatively, the periodical patterns may be successively configured without a gap therebetween.

Figure 8:
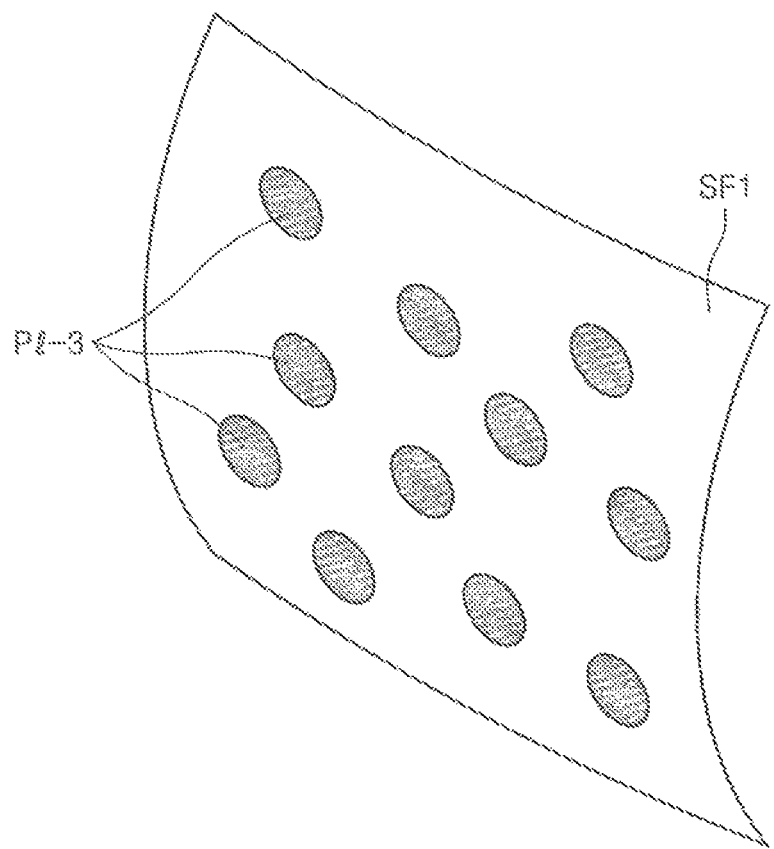
FIG. 8 is a diagram of structured light according to an example embodiment.

FIG. 8 is a diagram of structured light, according to another example embodiment. Referring to FIG. 8, the structured light may have a random pattern. The meta-pattern layer according to the example embodiment may change the light from the light source so that the structured light may have a random pattern.

Figure 9:
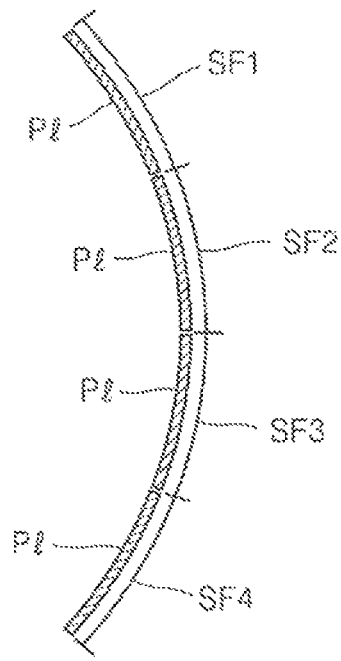
FIG. 9 is a schematic diagram of a nanostructured optical element and structured light according to an example embodiment.

FIG. 9 is a schematic diagram of the structured light formed on the spatial frequency domain SF, according to an example embodiment. Referring to FIG. 9, the nanostructured optical element according to the example embodiment illustrated in FIGS. 1 to 8 may form the structured light PI on the spatial frequency domain SF so as not to overlap one another. That is, the structured light PI formed on each sub-spatial frequency domain SF-1, SF-2, SF-3, and SF-4 may be configured so as not to overlap with the structured light PI formed on an adjacent sub-spatial frequency domain. The meta-pattern layer may have the arrangement of the nano-posts for forming the above structured light P1.

Figure 10:
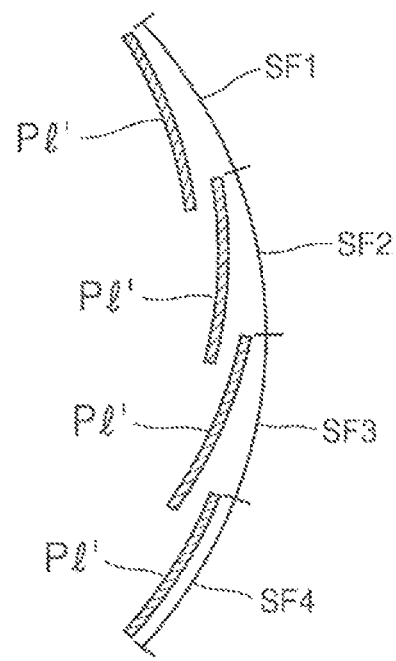
FIG. 10 is a schematic diagram of a nanostructured optical element and structured light according to an example embodiment.

FIG. 10 is a schematic diagram of structured light formed on a spatial frequency domain SF', according to another example embodiment. Referring to FIG. 10, the nanostructured optical element according to the example embodiment illustrated with reference to FIGS. 1 to 8 may form the structured light P1' to overlap with one another on the spatial frequency domain SF'. That is, the structured light P1' formed on each sub-spatial frequency domain SF'-1, SF'-2, SF'-3, and SF'-4 may be configured so as to overlap with the structured light PI formed on an adjacent sub-spatial frequency domain. The meta-pattern layer may have the arrangement of the nano-posts for forming the above structured light P1'.

Figure 11:
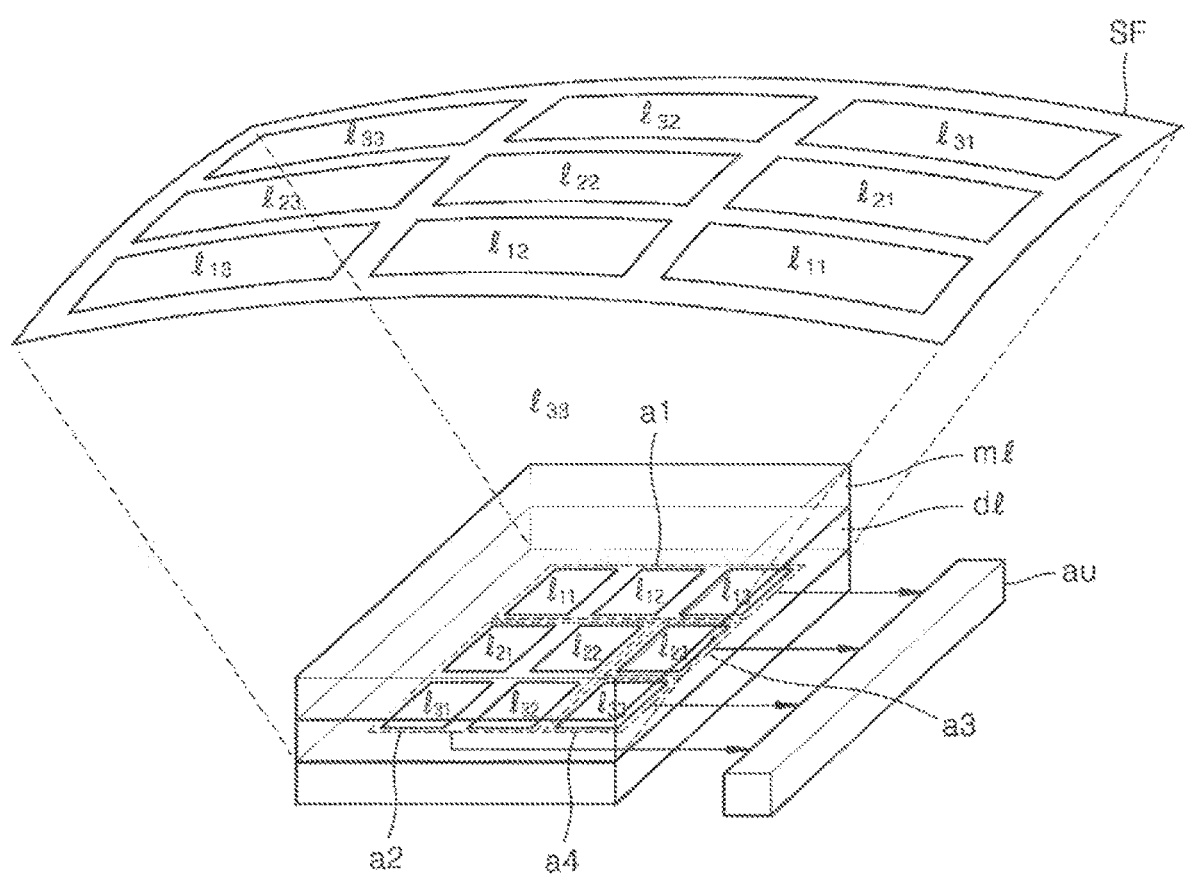
FIG. 11 is a schematic diagram illustrating a laser addressing operation of an addressing unit according to an example embodiment.

FIG. 11 is a diagram illustrating a laser addressing operation of an addressing unit au according to an example embodiment. Referring to FIG. 11, a plurality of laser sources I11, I12, I13, I21, I22, I23, I31, I32, and I33 irradiating light are configured as a matrix, and the addressing unit au that independently addresses operation of each laser source is provided.

The plurality of laser sources I11, I12, I13, I21, I22, I23, I31, I32, and I33 may be configured as an i×j matrix, wherein the index "i" is in a row direction and the index "j" is in a column direction. Referring to FIG. 11, the plurality of laser sources I11, I12, I13, I21, I22, I23, I31, I32, and I33 are configured as a matrix (i=1, 2, 3, and j=1, 2, 3), but are not limited thereto. Hereinafter, operations of the addressing unit au will be described below based on a plurality of laser sources Iij that are conventionally configured.

In some example embodiments, the addressing unit "au" may separately adjust the plurality of laser sources Iij to be turned on/turned off in a certain order according to time. For example, the addressing unit "au" may drive the plurality of laser sources Iij that are configured to be turned on/turned off, for example sequentially turned on/turned off. For example, the plurality of laser sources from j=1 to j=n may be turned on/turned off, for example sequentially turned on/turned off, and the plurality of laser sources from i=1 to i=m may be always turned on. Through the above operation, the structured light may be irradiated to scan the spatial frequency domain in a direction. Here, "m" denotes the total number of rows and "n" denotes the total number of columns. Otherwise, the addressing unit "au" may turn on/turn off, for example sequentially turn on/turn, off the plurality of laser sources that are arrayed in the row direction. For example, the plurality of laser sources from j=1 to j=n may be always turned on, and may be turned on/turned off, for example sequentially turned on/turned off, from i=1 to i=m. Through the above operation, the structured light may be irradiated to scan the spatial frequency domain in a direction. Here, "m" denotes the total number of rows and "n" denotes the total number of columns. For example, the addressing unit "au" may turn on/turn off in units of groups, wherein the group includes some of the plurality of laser sources Iij. For example, 2×2 laser sources may be defined as one group, and then the laser sources may be turned on/turned off in units of groups. Through the above operation, the structured light may be irradiated to scan a desired spatial area in the spatial frequency domain. Otherwise, the addressing unit "au" may separately control the plurality of laser sources Iij. Through the above operation, the structured light may be irradiated to scan an arbitrary spatial area in the spatial frequency domain.

Each of, or at least one of, the plurality of laser sources I11, I12, I13, I21, I22, I23, I31, I32, and I33 may form a corresponding structured light pattern on the spatial frequency domain SF in one-to-one correspondence. Since the light irradiated from each of, or at least one of, the laser sources I11, I12, I13, I21, I22, I23, I31, I32, and I33 transmits through the effective zone "ez" of the meta-pattern layer "ml" while changing the proceeding direction thereof in the deflecting layer "dl," a location of the structured light corresponding to each of, or at least one of, the laser sources may be changed on the spatial frequency domain SF. For example, as shown in FIG. 11, the configuration of the structured light formed on the spatial frequency domain SF by the light irradiated from the plurality of laser sources I11, I12, I13, I21, I22, I23, I31, I32, and I33 may be reversed 180° degrees from the configuration of the plurality of laser sources. However, the example embodiments are not limited to the above example.

When the addressing unit au only controls some of the plurality of laser sources I11, I12, I13, I21, I22, I23, I31, I32, and I33, the structured light may be formed only on the spatial frequency domain SF corresponding to the controlled laser source. Since the nanostructured optical element according to the example embodiment further includes the addressing unit au, the scanning operation may be performed in a certain type and a temporal order on the spatial frequency domain SF. For example, the scanning operation of an appropriate manner may be performed according to the shape of the object and application of the depth sensing.

Figure 12:
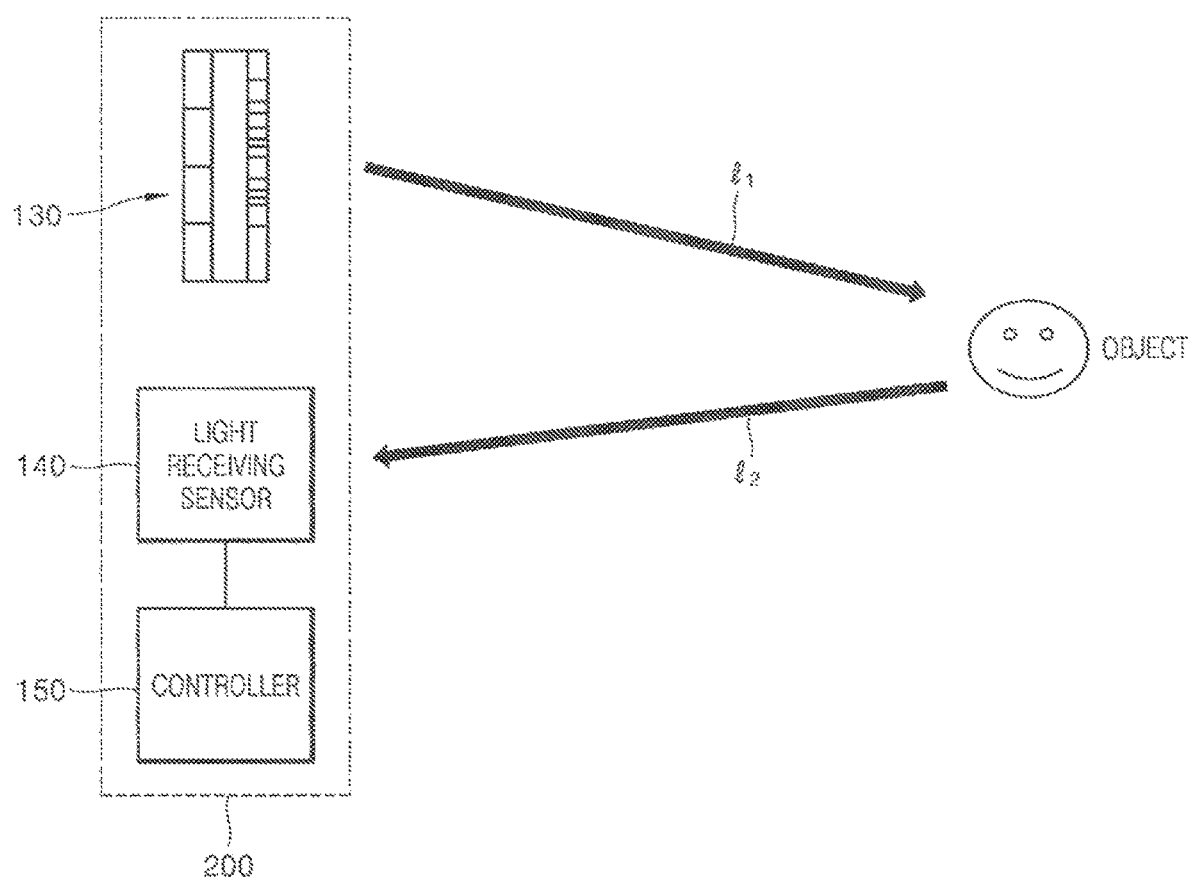
FIG. 12 is a schematic diagram of a depth sensor according to an example embodiment.

FIG. 12 is a schematic diagram of a depth sensor 200 according to an example embodiment. The depth sensor 200 may include a nanostructured optical element 130 irradiating structured light I1 to an object, a light-receiving sensor 140 receiving structured light I2 reflected by the object, and a controller 150 obtaining distance information by analyzing structured light distorted in the light-receiving sensor 140.

Optical elements for performing additional functions, e.g., adjusting the direction of the light towards the object, adjusting a size of a beam, etc., may be further arranged between the nanostructured optical element 130 and the object.

The light-receiving sensor 140 senses the structured light reflected by the object. The light-receiving sensor 140 may include an array of photodetecting elements. The light-receiving sensor 140 may further include a dispersing optical element for analyzing the structured light reflected by the object in units of wavelengths.

The controller 150 may analyze the light received by the light-receiving sensor 140 to analyze the depth information from a distortion degree of the structured light. Also, the controller 150 may control operations of the nanostructured optical element 130 and the light-receiving sensor 140. For example, the controller 150 may further include a memory unit storing an operating program for extracting three-dimensional information for analyzing the depth information.

Figure 13:
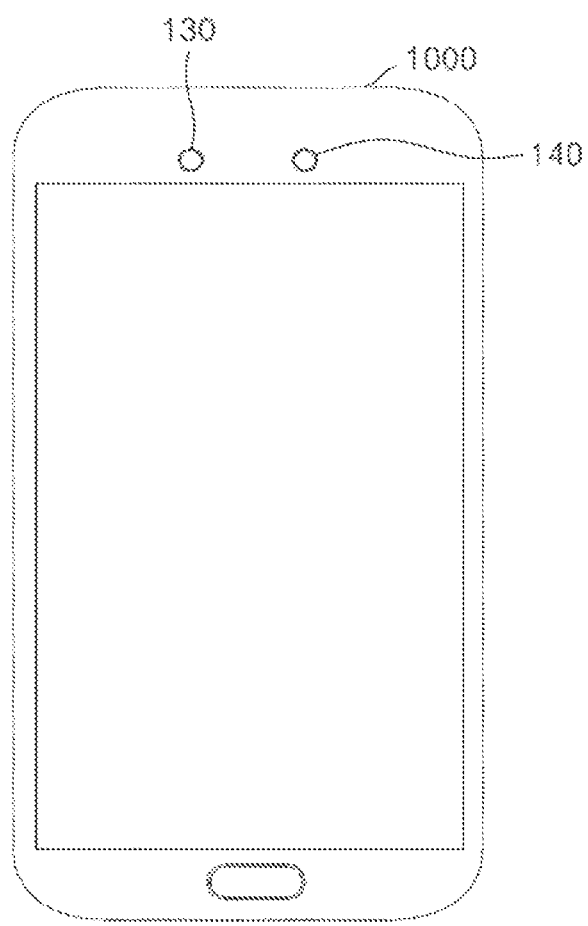
FIG. 13 is a diagram of an electronic device including a depth sensor according to an example embodiment.

FIG. 13 is a diagram of an electronic device 1000 including a depth sensor according to an example embodiment. Referring to FIG. 13, the electronic device 1000 may include the nanostructured optical element 130 irradiating structured light and the light-receiving sensor 140 sensing the structured light.

A depth sensor 1100 may be used in various electronic devices 1000 since the depth sensor 1100 may accurately obtain three-dimensional information about an object. For example, the electronic device 1000 may be a smartphone, but is not limited thereto. The electronic device 1000 may be a mobile communication device including a smartphone, an Internet of things (IoT) device, or an augmented reality device. Otherwise, the electronic device 1000 may be an autonomous driving device such as an unmanned vehicle, an autonomous driving vehicle, a robot, a drone, etc.

Figure 14A:
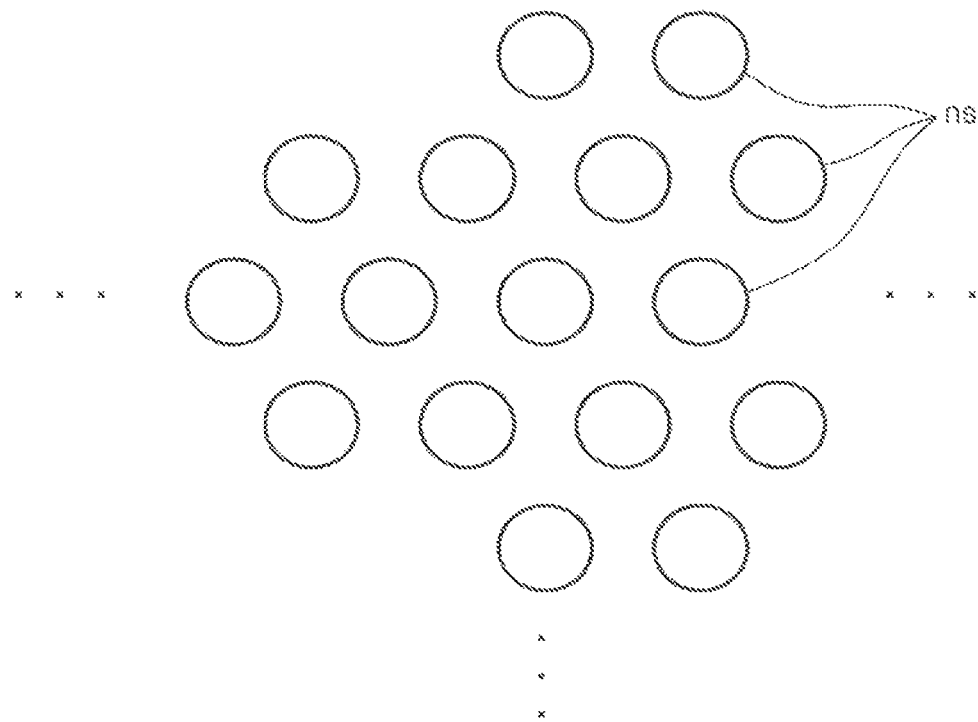
FIGS. 14A and 14B are schematic diagrams showing arrangement of nano-posts according to an example embodiment.
Figure 14B:
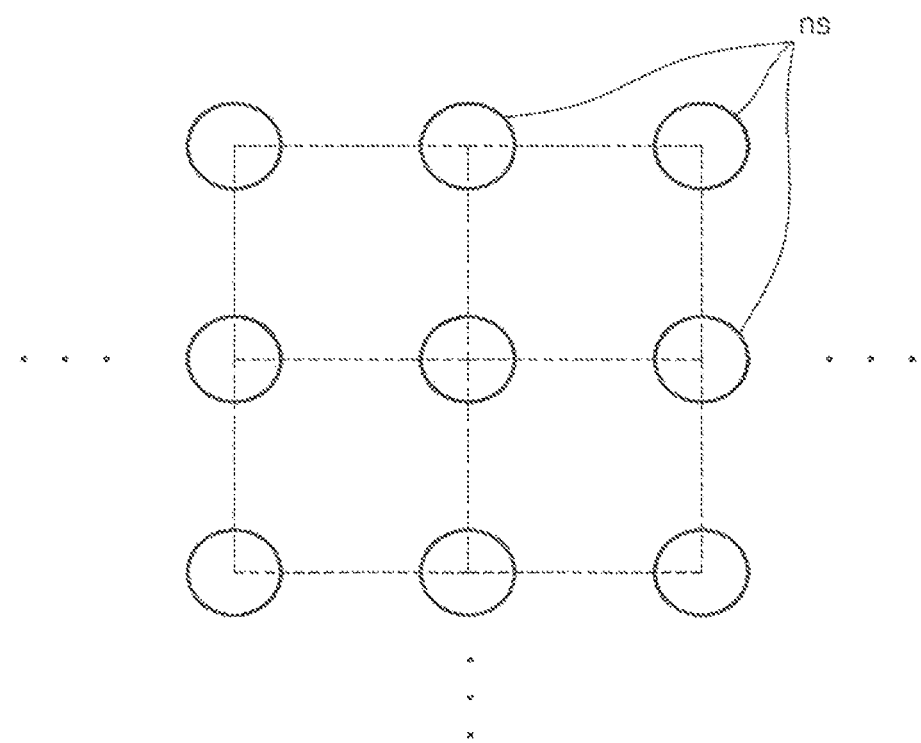

FIGS. 14A and 14B are schematic diagrams showing arrangement of nano-posts according to an example embodiment.

Referring to FIG. 14A, the plurality of first nano-posts ns may be configured as a hexagonal lattice. The above configuration may have an excellent optical characteristic modulation property.

Referring to FIG. 14B, the plurality of first nano-posts ns may be configured as a rectangular lattice. The above configuration may be easily manufactured.

It should be understood that example embodiments described herein should be considered in a descriptive sense only and not for purposes of limitation. Descriptions of features within each example embodiment should typically be considered as available for other similar features in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. An electronic device comprising:
a nanostructured optical element configured to radiate light to an object; and
a light-receiving sensor configured to receive the light reflected from the object;
wherein the nanostructured optical element comprises a light source in which a plurality of laser sources radiating light are configured as an array, a meta-pattern layer including a plurality of two-dimensionally configured first nano-posts satisfying a sub-wavelength condition, the plurality of first nano-posts being configured to change the light from the light source into structured light, a deflecting layer between the light source and the meta-pattern layer, the deflecting layer being configured to change a proceeding direction of the light to make the light from the light source incident to the meta-pattern layer, and a peripheral material layer provided on the meta-pattern layer opposite to the deflecting layer, the peripheral material layer encapsulating the plurality of first nano-posts,
wherein each of the plurality of first nano-posts has a refractive index that is greater than a refractive index of the peripheral material layer by one (1) or more.

2. The nanostructured optical element of claim 1, further comprising:
a supporting layer between the meta-pattern layer and the deflecting layer,
wherein the meta-pattern layer is on a first surface of the supporting layer, and the deflecting layer is on a second surface of the supporting layer.

3. The nanostructured optical element of claim 1, wherein the meta-pattern layer further comprises a supporting layer supporting the plurality of first nano-posts, and the meta-pattern layer has a refractive index that is greater than a refractive index of the supporting layer by one (1) or more.

4. The nanostructured optical element of claim 1, wherein the plurality of first nano-posts are configured as a hexagonal lattice or a rectangular lattice.

5. The nanostructured optical element of claim 1, wherein the plurality of first nano-posts have asymmetric forms.

6. The nanostructured optical element of claim 1, wherein the plurality of first nano-posts have multi-layered structures.

7. The nanostructured optical element of claim 1, wherein the plurality of first nano-posts include a metal material.

8. The nanostructured optical element of claim 1, wherein the plurality of first nano-posts are configured so that the structured light that passes through the meta-pattern layer does not overlap with one another in a spatial frequency domain.

9. The nanostructured optical element of claim 1, wherein the plurality of first nano-posts are configured so that the structured light that passes through the meta-pattern layer overlaps with other structured light on a spatial frequency domain.

10. The nanostructured optical element of claim 1, wherein the meta-pattern layer changes the light from the light source into structured light having one-dimensional periodical pattern or structured light having two-dimensional periodical pattern.

11. The nanostructured optical element of claim 1, wherein the meta-pattern layer changes the light from the light source into structured light having random pattern.

* * * * *